(12) United States Patent
Huang

(10) Patent No.: US 12,400,704 B2
(45) Date of Patent: Aug. 26, 2025

(54) INPUT SAMPLING SYSTEM AND METHOD, STORAGE MEDIUM, AND COMPUTER DEVICE

(71) Applicant: CHANGXIN MEMORY TECHNOLOGIES, INC., Hefei (CN)

(72) Inventor: Zequn Huang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 303 days.

(21) Appl. No.: 18/152,998

(22) Filed: Jan. 11, 2023

(65) Prior Publication Data
US 2023/0147404 A1    May 11, 2023

Related U.S. Application Data

(63) Continuation of application No. PCT/CN2021/129258, filed on Nov. 8, 2021.

(30) Foreign Application Priority Data

Jul. 7, 2021   (CN) .......................... 202110769181.4

(51) Int. Cl.
G11C 16/04        (2006.01)
G11C 11/4076      (2006.01)
(Continued)

(52) U.S. Cl.
CPC .......... *G11C 11/4076* (2013.01); *H03K 3/037* (2013.01); *H03K 19/20* (2013.01)

(58) Field of Classification Search
CPC ................................................ G11C 11/4076
See application file for complete search history.

(56) References Cited

U.S. PATENT DOCUMENTS 8,433,276 B2 * 4/2013 Morishita ............ H03H 15/023
                                                  455/313
9,389,953 B2   7/2016 Choi et al.
(Continued)

FOREIGN PATENT DOCUMENTS

| CN | 100397529 C  | 6/2008 |
| CN | 109903793 A  | 6/2019 |
| CN | 112185436 A  | 1/2021 |

OTHER PUBLICATIONS

International Search Report cited in PCT/CN2021/129258 mailed Apr. 6, 2022, 8 pages.

*Primary Examiner* — Pho M Luu
(74) *Attorney, Agent, or Firm* — SYNCODA LLC; Feng Ma

(57) ABSTRACT

An input sampling system and method, a storage medium, and a computer device involve: a signal processing circuit configured to receive an initial chip select signal and a command/address signal, and broaden a pulse width of a valid signal in the initial chip select signal backward to obtain a first chip select signal, to control an end moment of a valid signal in the first chip select signal to be later than an end moment of a valid signal in the command/address signal; and an input sampling circuit connected to the signal processing circuit, and configured to receive the command/address signal, the first chip select signal, and a clock pulse signal and sample the command/address signal according to the first chip select signal and the clock pulse signal.

15 Claims, 4 Drawing Sheets

(51) Int. Cl.
*H03K 3/037* (2006.01)
*H03K 19/20* (2006.01)

(56) References Cited

U.S. PATENT DOCUMENTS

| | | |
|---|---|---|
| 10,354,704 B2 | 7/2019 | Jung et al. |
| 10,796,737 B1 | 10/2020 | Oh et al. |
| 11,115,034 B2 * | 9/2021 | Chen ........................ H03K 3/356 |
| 11,281,279 B2 * | 3/2022 | Sodhi ..................... G06F 1/3206 |
| 2017/0110165 A1 | 4/2017 | Kim et al. |
| 2017/0110169 A1 | 4/2017 | Kim et al. |
| 2023/0386557 A1 * | 11/2023 | Huang ................. G11C 11/4076 |

* cited by examiner

INPUT SAMPLING SYSTEM AND METHOD, STORAGE MEDIUM, AND COMPUTER DEVICE

CROSS-REFERENCE TO RELATED APPLICATIONS

This is a continuation of International Application No. PCT/CN2021/129258, filed on Nov. 8, 2021, which claims the priority to Chinese Patent Application No. 202110769181.4, titled "INPUT SAMPLING SYSTEM AND METHOD, STORAGE MEDIUM, AND COMPUTER DEVICE" and filed with the China National Intellectual Property Administration (CNIPA) on Jul. 7, 2021. The entire contents of International Application No. PCT/CN2021/129258 and Chinese Patent Application No. 202110769181.4 are incorporated herein by reference.

TECHNICAL FIELD

The present disclosure includes, but is not limited to, an input sampling system and method, a storage medium, and a computer device.

BACKGROUND

At present, in the input sampling system of a double data rate (DDR) synchronous dynamic random access memory (DRAM), a control/address (C/A) signal and a clock signal respectively enter a sampling circuit through a receiver, the C/A signal is then sampled on the basis of the clock signal, and the C/A signal synchronized is outputted for subsequent logic operations. However, since the C/A signal is shared by a plurality of DRAMs in the design of dual inline memory modules (DIMMs) of the DRAMs, specific DRAM control is distinguished by a chip select (CS) signal. Different DRAMs share a C/A data bus to receive a same C/A signal and receive different CS signals. Therefore, it is necessary to determine whether the received C/A signal is valid according to the CS signal.

However, as the frequency of the DRAM increases, the pulse width of the C/A signal and the pulse width of the CS signal continue to decrease. Since a path traversed by the C/A signal and a path traversed by the CS signal are different, at a logic circuit where the CS signal selects the C/A signal, there will be a skew between the CS signal and the C/A signal, making an end moment of a valid signal in the C/A signal later than an end moment of a valid signal in the CS signal. Considering the influence of process, voltage and temperature variation (PVT), the valid pulse width of the C/A signal after the selection will be reduced, and the C/A after the end of the valid signal in the CS signal cannot be collected, which may cause C/A sampling to fail.

SUMMARY

The present disclosure provides an input sampling system, including:

a signal processing circuit configured to receive an initial CS signal and a C/A signal, and broaden a pulse width of a valid signal in the initial CS signal backward to obtain a first CS signal, to control an end moment of a valid signal in the first CS signal to be later than an end moment of a valid signal in the C/A signal; and an input sampling circuit connected to the signal processing circuit, and configured to receive the C/A signal, the first CS signal, and a clock pulse signal and sample the C/A signal according to the first CS signal and the clock pulse signal.

An Input Sampling Method Includes:

acquiring an initial CS signal and a C/A signal;

broadening a pulse width of a valid signal in the initial CS signal backward to obtain a first CS signal, to control an end moment of a valid signal in the first CS signal to be later than an end moment of a valid signal in the C/A signal; and acquiring a clock pulse signal; and sampling the C/A signal on the basis of the first CS signal and the clock pulse signal.

A computer device includes a memory and a processor, where the memory stores a computer program, and the computer program is executed by the processor to implement the steps of the method according to any one of the above embodiments.

A computer-readable storage medium stores a computer program, where the computer program is executed by a processor to implement the steps of the method according to any one of the above embodiments.

BRIEF DESCRIPTION OF THE DRAWINGS

The drawings incorporated into the specification and constituting part of the specification illustrate the embodiments of the present disclosure, and are used together with the description to explain the principles of the embodiments of the present disclosure. In these accompanying drawings, similar reference numerals represent similar elements. The accompanying drawings in the following description illustrate some rather than all of the embodiments of the present disclosure. Those skilled in the art may obtain other accompanying drawings based on these accompanying drawings without creative efforts.

One or more embodiments are exemplified by corresponding accompanying drawings, and these exemplified descriptions do not constitute a limitation on the embodiments. Components with the same reference numerals in the accompanying drawings are denoted as similar components, and the accompanying drawings are not limited by scale unless otherwise specified.

To describe the technical solutions in the embodiments of the present disclosure more clearly, the accompanying drawings required to describe the embodiments are briefly described below. Apparently, the accompanying drawings described below are only some embodiments of the present disclosure. A person of ordinary skill in the art may further obtain accompanying drawings of other embodiments based on these accompanying drawings without creative efforts.

Figure 1:
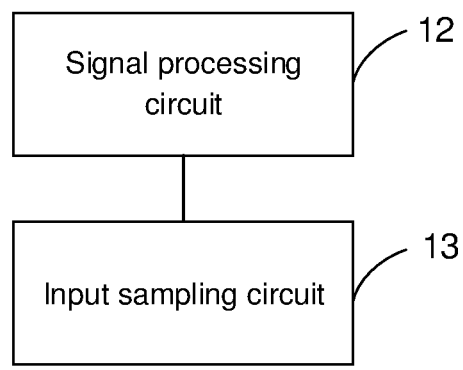
Figure 2:
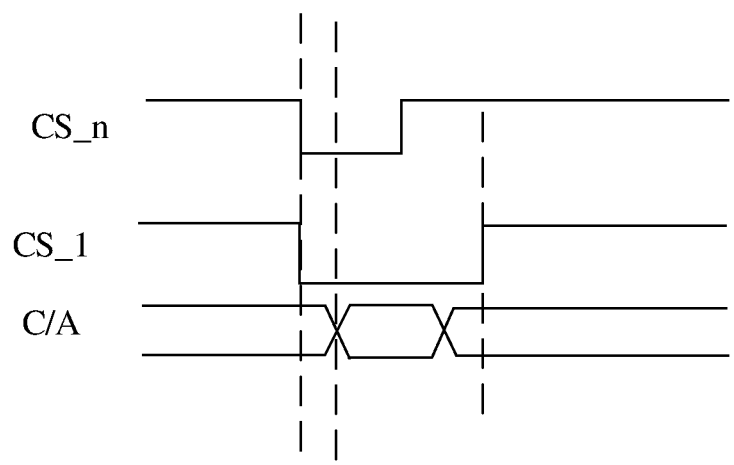
Figure 3:
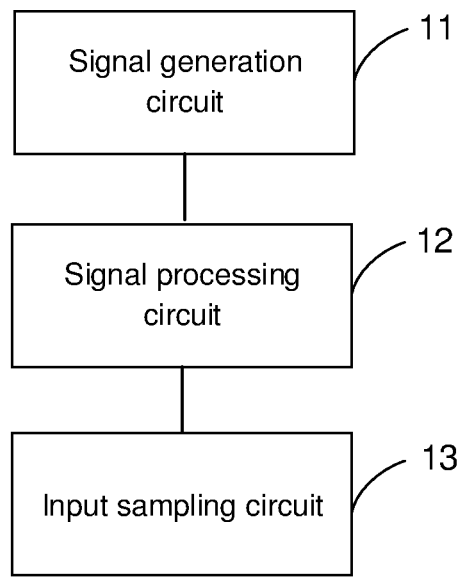
Figure 4:
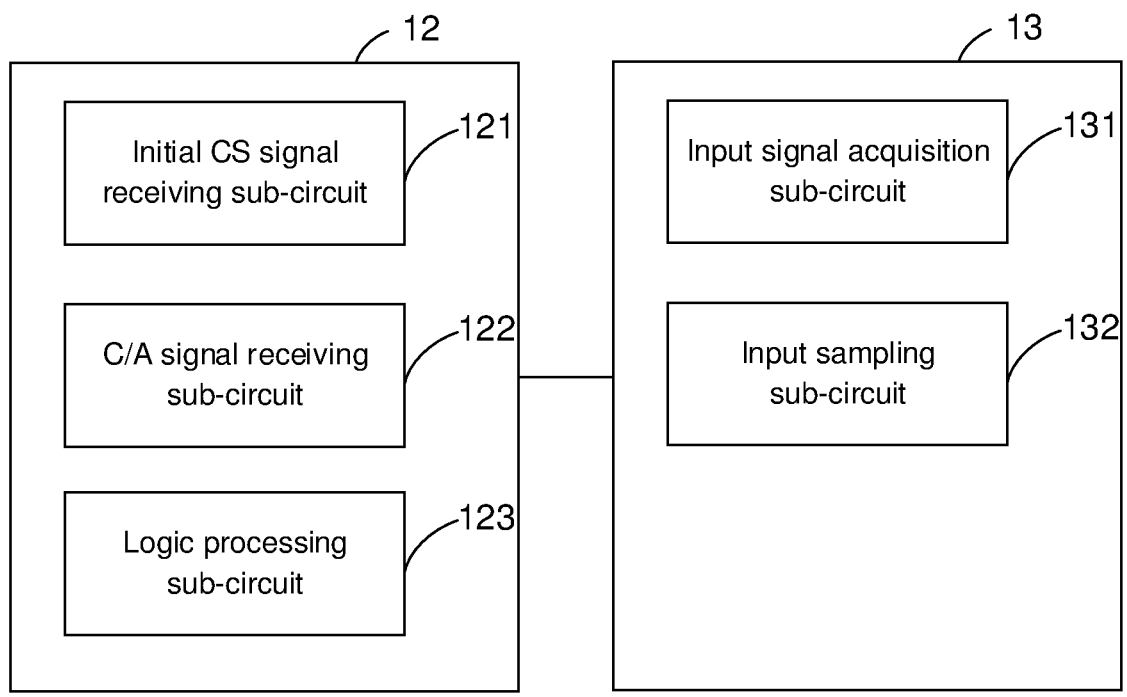
Figure 5:
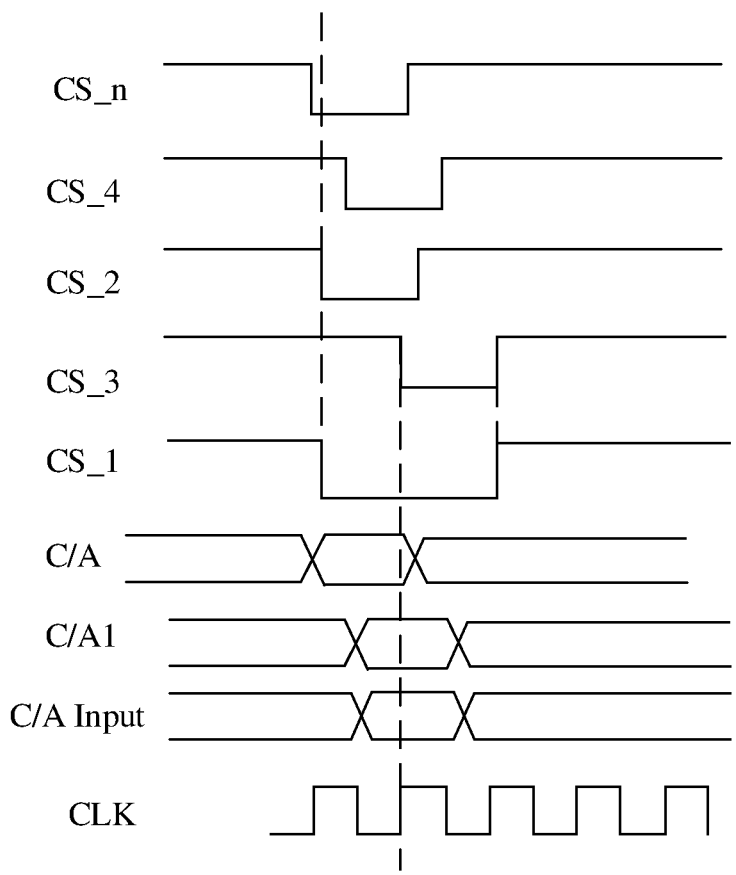
Figure 6:
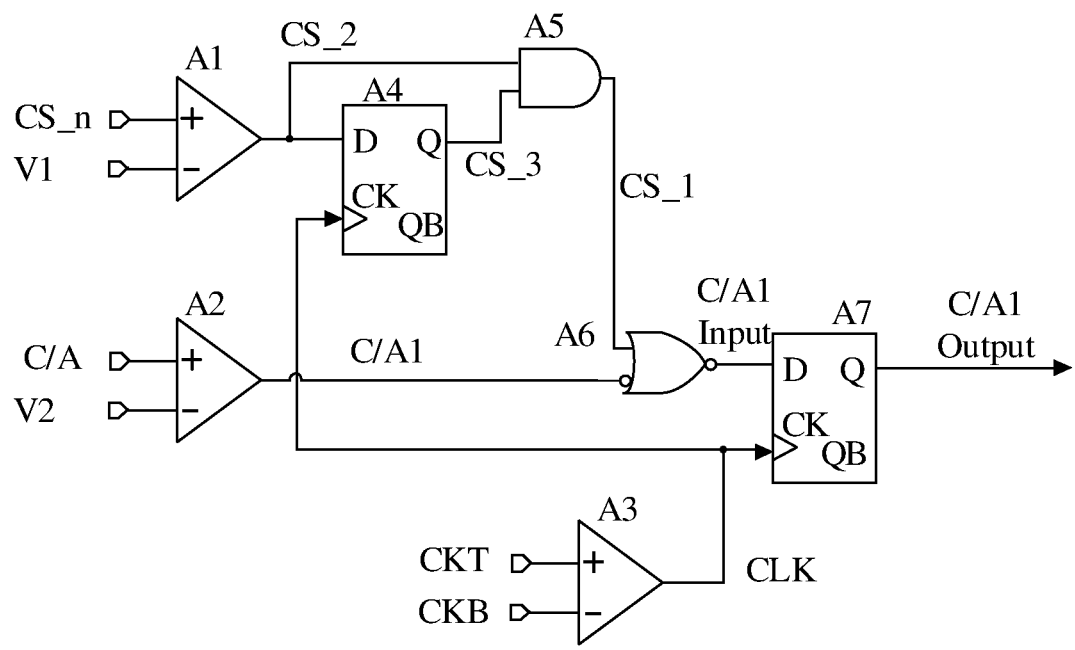
Figure 7:
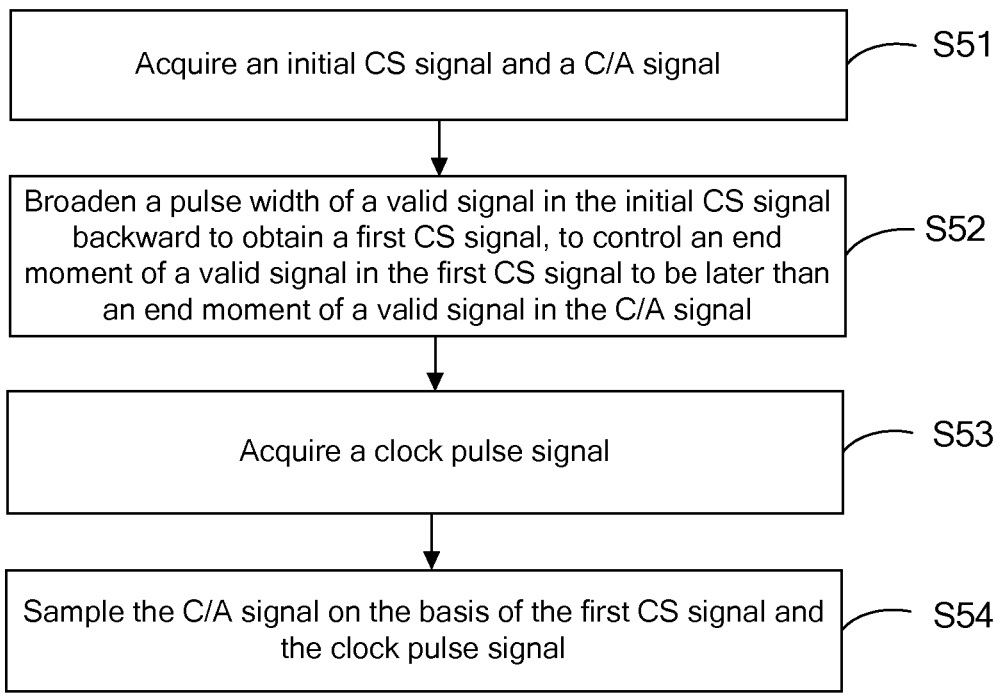

FIG. 1 is a structural block diagram of an input sampling system according to one embodiment of the present disclosure;

FIG. 2 is a waveform diagram of each signal in an input sampling system according to one embodiment of the present disclosure;

FIG. 3 is a structural block diagram of an input sampling system according to another embodiment of the present disclosure;

FIG. 4 is a structural block diagram of an input sampling system according to another embodiment of the present disclosure;

FIG. 5 is a waveform diagram of each signal in an input sampling system according to another embodiment of the present disclosure;

FIG. 6 is a circuit diagram of an input sampling system according to one embodiment of the present disclosure; and FIG. 7 is a flow diagram of an input sampling method according to one embodiment of the present disclosure.

DETAILED DESCRIPTION

To facilitate the understanding of the present disclosure, the present disclosure is described more completely below with reference to the accompanying drawings. Preferred embodiments of the present disclosure are shown in the accompanying drawings. However, the present disclosure may be embodied in various forms without being limited to the embodiments described herein. On the contrary, these embodiments are provided to make the present disclosure more thorough and comprehensive.

Unless otherwise defined, all technical and scientific terms used herein have the same meaning as commonly understood by those skilled in the technical field of the present disclosure. The terms used herein are merely for the purpose of describing specific embodiments, and are not intended to limit the present disclosure.

It should be understood that if an element or a layer is described as "being on", "being adjacent to", "being connected to" or "being coupled to" another element or layer, it can be on, adjacent to, connected to, or coupled to the another element or layer directly, or intervening elements or layers may be present. On the contrary, if an element is described as "being directly on", "being directly adjacent to", "being directly connected to" or "being directly coupled to" another element or layer, there are no intervening elements or layers. It should be understood that although terms such as first, second, and third may be used to describe various elements, components, regions, layers, doped types and/or sections, these elements, components, regions, layers, doped types and/or sections should not be limited by these terms. These terms are only used to distinguish one element, component, region, layer, doping type or section from another element, component, region, layer, doping type or section. Therefore, without departing from the teachings of the present disclosure, a first element, component, region, layer, doping type or section discussed below may be a second element, component, region, layer, doping type or section. For example, the first doping type may be the second doping type, and similarly, the second doping type may be the first doping type; or the first doping type and the second doping type are different doping types, for example, the first doping type may be P-type and the second doping type may be N-type, or the first doping type may be N-type and the second doping type may be P-type.

Spatial relationship terms such as "under", "beneath", "lower", "below", "above", and "upper" can be used herein to describe the relationship shown in the figure between one element or feature and another element or feature. It should be understood that in addition to the orientations shown in the figure, the spatial relationship terms further include different orientations of used and operated devices. For example, if a device in the accompanying drawings is turned over, an element or feature described as being "beneath another element", "below it", or "under it" is oriented as being "on" the another element or feature. Therefore, the exemplary terms "beneath" and "under" may include two orientations of above and below. In addition, the device may further include other orientations (for example, a rotation by 90 degrees or other orientations), and the spatial description used herein is interpreted accordingly.

In the specification, the singular forms of "a", "an" and "the/this" may also include plural forms, unless clearly indicated otherwise. It should also be understood that terms "include" and/or "comprise", if used in this specification, may determine the presence of features, integers, steps, operations, elements and/or components, but do not exclude the presence or addition of one or more other features, integers, steps, operations, elements, components and/or groups. In this case, in this specification, the term "and/or" includes any and all combinations of related listed items.

Embodiments of the present disclosure are described herein with reference to cross-sectional views as schematic diagrams of idealized embodiments (and intermediate structures) of the present disclosure, such that variations shown in the shapes and due to, for example, manufacturing techniques and/or tolerances can be contemplated. Therefore, the embodiments of the present disclosure should not be limited to the specific shapes of the regions shown herein, but include shape deviations due to, for example, manufacturing techniques. For example, an injection region displayed as a rectangle usually has a circular or curved feature and/or injection concentration gradient at an edge of the region, rather than a binary change from the injection region to a non-injection region. Similarly, a buried region formed by injection can lead to some injection in a region between the buried region and a surface through which the injection is carried out. Therefore, the regions shown in the figure are schematic in nature, and their shapes are not intended to show actual shapes of the regions of the device or limit the scope of the present disclosure.

Referring to FIG. 1, the present disclosure provides an input sampling system. The input sampling system includes a signal processing circuit 12 and an input sampling circuit 13. The signal processing circuit 12 is configured to receive an initial CS signal and a C/A signal, and broaden a pulse width of a valid signal in the initial CS signal backward to obtain a first CS signal, to control an end moment of a valid signal in the first CS signal to be later than an end moment of a valid signal in the C/A signal. The input sampling circuit 13 is connected to the signal processing circuit 12, and is configured to receive the C/A signal, the first CS signal, and a clock pulse signal and sample the C/A signal according to the first CS signal and the clock pulse signal.

Referring to FIG. 2 together, the signal processing circuit 12 receives the initial CS signal $CS\_n$ and the C/A signal C/A. The signal processing circuits 12 of the input sampling systems in different DRAMs receive a same C/A signal C/A, and receive different initial CS signals $CS\_n$. The initial CS signal $CS\_n$ received by each signal processing circuit 12 can be configured according to a time period in which each DRAM operates. The initial CS signal $CS\_n$ and the C/A signal C/A can be sent by a device outside the input sampling system and received by the signal processing circuit 12; and it can also be configured that the initial CS signal $CS\_n$ and the C/A signal C/A are generated by the input sampling system.

The signal processing circuit 12 improves the received initial CS signal $CS\_n$, and broadens a pulse width of a valid signal in the initial CS signal $CS\_n$ backward to obtain a first CS signal $CS\_1$. In this embodiment, the backward broadening of the pulse width of the valid signal in the initial CS signal $CS\_n$ refers to the backward broadening of the pulse width of the valid signal in the initial CS signal $CS\_n$ on the basis of time, such that the end moment of the valid signal in the first CS signal $CS\_1$ is later than the end moment of the valid signal in the initial CS signal $CS\_n$, and the pulse width of the valid signal in the first CS signal $CS\_1$ is greater than the pulse width of the valid signal in the initial CS signal $CS\_n$. The width of the initial CS signal $CS\_n$ broadened backward is configured according to actual requirements, such that the end moment of the valid signal in the first CS signal CS_1 is later than the end moment of the valid signal in the C/A signal C/A.

The input sampling circuit 13 is connected to the signal processing circuit 12 to obtain the C/A signal C/A and the first CS signal CS_1 outputted by the signal processing circuit 12. The input sampling circuit 13 also receives the clock pulse signal sent by the device outside the input sampling system or generated by the input sampling system, and samples the C/A signal C/A according to the first CS signal CS_1 and the clock pulse signal. If the input sampling circuit 13 samples the C/A signal C/A, the end moment of the valid signal in the first CS signal CS_1 is later than the end moment of the valid signal in the C/A signal C/A, such that if the C/A signal C/A deviates from the initial CS signal CS_n, and the end moment of the valid signal in the C/A signal C/A is later than the end moment of the valid signal in the initial CS signal CS_n, it can be ensured that a time period of maintaining the valid signal in the C/A signal C/A is within a time period of maintaining the valid signal in the first CS signal CS_1, such that the complete C/A signal C/A can be collected.

The above input sampling system improves the received initial CS signal CS_n, such that the input sampling systems of different DRAMs respectively sample the C/A signal C/A on the basis of the corresponding improved initial CS signal CS_n, namely the first CS signal CS_1. If the input sampling system does not receive the initial CS signal CS_n or the first CS signal CS_1 is an invalid signal, even if the input sampling system receives the C/A signal C/A, the C/A signal C/A is not executed, that is, the C/A signal C/A is shielded, such that there is no data flipping within the input sampling system, thereby saving the power consumption of the input sampling system. If the input sampling system receives the valid signal in the first CS signal CS_1, the C/A signal C/A is sampled and executed. When the C/A signal C/A is sampled, the pulse width of the valid signal in the first CS signal CS_1 is broadened backward compared to the initial CS signal CS_n, such that even if the C/A signal C/A deviates from the initial CS signal CS_n, the end moment of the valid signal in the C/A signal C/A is later than the end moment of the valid signal in the initial CS signal CS_n, and it can be ensured that the time period of maintaining the valid signal in the C/A signal C/A is within the time period of maintaining the valid signal in the first CS signal CS_1, such that the complete C/A signal C/A can be collected, and the failure of the C/A signal C/A can be avoided.

In some embodiments, referring to FIG. 2 and FIG. 3, the input sampling system further includes a signal generation circuit 11. The signal generation circuit 11 is connected to the signal processing circuit 12. The signal generation circuit 11 is configured to send the initial CS signal CS_n and the C/A signal C/A, and control an arrival moment of the valid signal in the initial CS signal CS_n to be earlier than an arrival moment of the valid signal in the C/A signal C/A when a moment at which the signal generation circuit 11 sends the initial CS signal CS_n is earlier than a moment at which the signal generation circuit sends the C/A signal C/A.

The signal generation circuit 11 controls a moment of sending the valid signal in the initial CS signal CS_n and a moment of sending the valid signal in the C/A signal C/A to the processing circuit, such that the valid signal in the initial CS signal CS_n is sent ahead, and then, the signal processing circuit 12 broadens the received initial CS signal CS_n backward. This is equivalent to broaden the initial CS signal CS_n forward and backward, such that no matter whether the C/A signal C/A deviates forward or backward (both forward deviation and backward deviation are deviations based on time), it can be ensured that when the C/A signal C/A is sampled on the basis of the first CS signal CS_1, the time period of maintaining the valid signal in the C/A signal C/A is within the time period of maintaining the valid signal in the first CS signal CS_1, thereby ensuring that the complete C/A signal C/A is collected.

In some other embodiments, referring to FIG. 5, the signal processing circuit 12 is further configured to broaden the pulse width of the valid signal in the initial CS signal CS_n forward, to control an arrival moment of the valid signal in the first CS signal CS_1 to be earlier than an arrival moment of the valid signal in the C/A signal C/A.

The forward broadening of the pulse width of the valid signal in the initial CS signal CS_n refers to the forward broadening of the pulse width of the valid signal in the initial CS signal CS_n on the basis of time with respect to a CS signal CS_4 received in the prior art. In the prior art, after receiving the initial CS signal CS_n and the C/A signal C/A, the input sampling system will delay the initial CS signal CS_n to obtain the CS signal CS_4 and delay the C/A signal C/A. The arrival moment of the valid signal in the CS signal CS_4 after the delay and the arrival moment of the valid signal in the C/A signal C/A may be a same moment, and the delayed C/A signal C/A is sampled on the basis of the CS signal CS_4. In this embodiment, the signal processing circuit 12 may delay the received initial CS signal CS_n and C/A signal C/A, but the time of delaying the initial CS signal CS_n may be less than the time of delaying the initial CS signal CS_n in the prior art, such that the arrival moment of the valid signal in the initial CS signal CS_n is earlier than the arrival moment of the valid signal in the C/A signal C/A, thereby achieving the purpose of forward broadening the pulse width of the valid signal in the initial CS signal CS_n.

In this embodiment, the valid signal in the first CS signal CS_1 is sent ahead and broadened backward compared to the traditional CS signal CS_4, such that no matter whether the C/A signal C/A deviates forward or backward (both forward deviation and backward deviation are deviations based on time), it can be ensured that when the C/A signal C/A is sampled on the basis of the first CS signal CS_1, the time period of maintaining the valid signal in the C/A signal C/A is within the time period of maintaining the valid signal in the first CS signal CS_1, thereby ensuring that the complete C/A signal C/A is collected.

In some embodiments, referring to FIG. 4 and FIG. 5, the signal processing circuit 12 includes an initial CS signal receiving sub-circuit 121, a C/A signal receiving sub-circuit 122, and a logic processing sub-circuit 123. The initial CS signal receiving sub-circuit 121 is configured to receive the initial CS signal CS_n and delay the initial CS signal CS_n to output a second CS signal CS_2. The C/A signal receiving sub-circuit 122 is configured to receive the C/A signal C/A and delay the C/A signal C/A to output a first C/A signal C/A1, where an absolute delay of the initial CS signal receiving sub-circuit 121 is less than an absolute delay of the C/A signal receiving sub-circuit 122. The absolute delay refers to the delay between a signal outputted by the initial CS signal receiving sub-circuit 121 or the C/A signal receiving sub-circuit 122 and the received signal, such that the arrival moment of the valid signal in the second CS signal CS_2 after the delay is earlier than the arrival moment of the valid signal in the first C/A signal C/A1. The logic processing sub-circuit 123 is connected to the initial CS signal receiving sub-circuit 121 and the C/A signal receiving sub-circuit 122, and is configured to delay the second CS signal CS_2 to obtain a third CS signal CS_3 and obtain the first CS signal CS_1 according to the second CS signal CS_2 and the third CS signal CS_3, where the arrival moment of the valid signal in the first CS signal CS_1 is the same as an arrival moment of a valid signal in the second CS signal CS_2, and the end moment of the valid signal in the first CS signal CS_1 is the same as an end moment of a valid signal in the third CS signal CS_3.

In some embodiments, referring to FIG. 4 to FIG. 6, the initial CS signal receiving sub-circuit 121 includes a first comparator A1. The first comparator A1 is provided with a non-inverting input terminal for inputting the initial CS signal CS_n, an inverting input terminal for inputting a first reference voltage V1, and an output terminal for outputting the second CS signal CS_2. If a voltage of the initial CS signal CS_n is higher than the first reference voltage V1, the second CS signal CS_2 is a high-level signal, and if the voltage of the initial CS signal CS_n is lower than the first reference voltage V1, the second CS signal CS_2 is a low-level signal, and the low-level signal in the second CS signal CS_2 is the valid signal in the second CS signal CS_2.

In some embodiments, referring to FIG. 4 to FIG. 6, the C/A signal receiving sub-circuit 122 includes a second comparator A2 provided with a non-inverting input terminal for inputting the C/A signal C/A, an inverting input terminal for inputting a second reference voltage V2, and an output terminal for outputting the first C/A signal C/A1, where if a voltage of the C/A signal C/A is higher than the second reference voltage V2, the first C/A signal C/A1 is a high-level signal, and if the voltage of the C/A signal C/A is lower than the second reference voltage V2, the first C/A signal C/A1 is a low-level signal. The first reference voltage V1 may be equal to the second reference voltage V2.

In some embodiments, referring to FIG. 4 to FIG. 6, the logic processing sub-circuit 123 includes a third comparator A3, a flip-flop A4, and an AND gate A5. The third comparator A3 is provided with a non-inverting input terminal for receiving a first clock signal CKT and an inverting input terminal for receiving a second clock signal CKB, and is configured to compare the first clock signal CKT with the second clock signal CKB to output the clock pulse signal CLK. The first clock signal CKT and the second clock signal CKB may be in a differential form of a same clock.

The flip-flop A4 is provided with a first input terminal connected to an output terminal of the initial CS signal receiving sub-circuit 121 for receiving the second CS signal CS_2. The flip-flop A4 is provided with a second input terminal connected to the third comparator A3 for receiving the clock pulse signal CLK. The flip-flop A4 is configured to delay the second CS signal CS_2 according to the clock pulse signal CLK to obtain the third CS signal CS_3. The delay time can be configured according to actual requirements.

The AND gate A5 is provided with a first input terminal connected to the output terminal of the initial CS signal receiving sub-circuit 121 for receiving the second CS signal CS_2. The AND gate A5 is provided with a second input terminal connected to an output terminal of the flip-flop A4 for receiving the third CS signal CS_3. The AND gate A5 is configured to perform logic AND on the second CS signal CS_2 and the third CS signal CS_3 to obtain the first CS signal CS_1. Therefore, the arrival moment of the valid signal in the first CS signal CS_1 outputted by the AND gate A5 is the same as an arrival moment of a valid signal in the second CS signal CS_2, and the end moment of the valid signal in the first CS signal CS_1 is the same as an end moment of a valid signal in the third CS signal CS_3.

In some embodiments, the flip-flop A4 is a rising edge flip-flop. The second CS signal CS_2 and the clock pulse signal CLK are respectively inputted through the two input terminals of the flip-flop A4. The third CS signal CS_3 is outputted through the output terminal of the rising edge flip-flop A4. The rising edge flip-flop A4 delays the second CS signal CS_2 on the basis of the clock pulse signal CLK, such that the arrival moment of the valid signal in the outputted third CS signal CS_3 is the same as the arrival moment of a first rising edge of the clock pulse signal CLK after the valid signal in the second CS signal CS_2 arrives.

In some embodiments, the clock pulse signal CLK is a periodic signal. Specifically, the delay time of the rising edge flip-flop A4 can be configured as required. The valid signals in the initial CS signal CS_n, the second CS signal CS_2, the third CS signal CS_3, and the first CS signal CS_1 are all low-level signals. If the input sampling system does not receive the initial CS signal CS_n or the first CS signal CS_1 obtained by improving the initial CS signal CS_n is a high-level signal, even if the C/A signal C/A is received, the C/A signal C/A is not executed.

In some embodiments, referring to FIG. 4 to FIG. 6, the input sampling circuit 13 includes an input signal acquisition sub-circuit 131 and an input sampling sub-circuit 132. The input signal acquisition sub-circuit 131 is provided with a first input terminal connected to the output terminal of the AND gate A5 for receiving the first CS signal CS_1. The input signal acquisition sub-circuit 131 is provided with a second input terminal connected to the C/A signal receiving sub-circuit 122 for receiving the first C/A signal C/A1. The input signal acquisition sub-circuit 131 is configured to sample the first C/A signal C/A1 during a valid signal period of the first CS signal CS_1 to obtain a C/A input signal C/A1 Input.

The input sampling sub-circuit 132 is provided with a first input terminal connected to an output terminal of the input signal acquisition sub-circuit 131 for receiving the C/A input signal C/A1 Input. The input sampling sub-circuit 132 is provided with a second input terminal connected to an output terminal of the third comparator A3 for receiving the clock pulse signal CLK. The input sampling sub-circuit 132 is configured to sample the C/A input signal C/A1 Input on the basis of the clock pulse signal CLK to obtain a C/A output signal C/A1 Output.

In some embodiments, referring to FIG. 4 to FIG. 6, the input signal acquisition sub-circuit 131 includes a NOT gate and a NOR gate (In FIG. 6, the NOT gate and the NOR gate are drawn together and represented as A6). The NOT gate is provided with an input terminal connected to the C/A signal receiving sub-circuit 122 for receiving the first C/A signal C/A1. The NOT gate is configured to invert the first C/A signal C/A1 to obtain a second C/A signal. The NOR gate is provided with a first input terminal connected to the output terminal of the AND gate for receiving the first CS signal CS_1. The NOR gate is provided with a second input terminal connected to an output terminal of the NOT gate for receiving the second C/A signal, and is configured to perform logic NOR on the second C/A signal and the first CS signal CS_1 to obtain the C/A input signal C/A1 Input.

In some embodiments, referring to FIG. 4 to FIG. 6, the input sampling sub-circuit 132 may include a latch A7. A first input terminal of the latch A7 is connected to the NOR gate for obtaining the C/A input signal C/A1 Input outputted by A6, and is connected to the comparator A3 for obtaining the clock pulse signal CLK outputted therefrom. The latch A7 is configured to sample the C/A input signal C/A1 Input on the basis of the clock pulse signal CLK to obtain the C/A output signal C/A1 Output.

The present disclosure further provides an input sampling method. Referring to FIG. 7, the input sampling method includes:

Step S51, acquire an initial CS signal and a C/A signal.

Step S52, broaden a pulse width of a valid signal in the initial CS signal backward to obtain a first CS signal, to control an end moment of a valid signal in the first CS signal to be later than an end moment of a valid signal in the C/A signal.

Step S53, acquire a clock pulse signal.

Step S54, sample the C/A signal on the basis of the first CS signal and the clock pulse signal.

It should be understood that although the steps in the flowchart of FIG. 7 are sequentially displayed according to the arrows, these steps are not necessarily performed in the order indicated by the arrows. The execution order of the steps is not strictly limited, and the steps may be executed in other orders, unless clearly described otherwise. Moreover, at least some of the steps in FIG. 7 may include a plurality of sub-steps or stages. The sub-steps or stages are not necessarily executed at the same time, but may be executed at different times. The sub-steps or stages are not necessarily carried out sequentially, but may be executed alternately with other steps or at least some of sub-steps or stages of other steps.

In some embodiments, the input sampling method further includes: send the initial CS signal and the C/A signal, and control an arrival moment of the valid signal in the initial CS signal to be earlier than an arrival moment of the valid signal in the C/A signal when a moment at which the initial CS signal is sent is earlier than a moment at which the C/A signal is sent.

In some embodiments, the input sampling method further includes: broaden the pulse width of the valid signal in the initial CS signal forward, to control an arrival moment of the valid signal in the first CS signal to be earlier than an arrival moment of the valid signal in the C/A signal.

In some embodiments, step S52 includes: delay the initial CS signal to output a second CS signal; delay the C/A signal to output a first C/A signal, where an absolute delay for the initial CS signal is less than an absolute delay for the C/A signal; delay the second CS signal to obtain a third CS signal, and obtain a first CS signal according to the second CS signal and the third CS signal, where the arrival moment of the valid signal in the first CS signal is the same as an arrival moment of a valid signal in the second CS signal, and the end moment of the valid signal in the first CS signal is the same as an end moment of a valid signal in the third CS signal.

In some embodiments, if a voltage of the initial CS signal is higher than the first reference voltage, the second CS signal is a high-level signal, and if the voltage of the initial CS signal is lower than the first reference voltage, the second CS signal is a low-level signal, and the low-level signal in the second CS signal is the valid signal in the second CS signal.

In some embodiments, if a voltage of the C/A signal is higher than the second reference voltage, the first C/A signal is a high-level signal, and if the voltage of the C/A signal is lower than the second reference voltage, the first C/A signal is a low-level signal.

In some embodiments, the step of delaying the second CS signal to obtain a third CS signal and obtaining the first CS signal according to the second CS signal and the third CS signal includes: delay the second CS signal according to the clock pulse signal to obtain a third CS signal; and perform logic AND on the second CS signal and the third CS signal to obtain the first CS signal.

In some embodiments, an arrival moment of the valid signal in the third CS signal is the same as an arrival moment of a first rising edge of the clock pulse signal after the valid signal in the second CS signal arrives.

In some embodiments, the clock pulse signal is a periodic signal, and the valid signals in the initial CS signal, the second CS signal, the third CS signal, and the first CS signal are all low-level signals.

In some embodiments, step S53 includes: receive a first clock signal and a second clock signal, and compare the first clock signal with the second clock signal to output the clock pulse signal. Step S54 includes: sample the first C/A signal during a valid signal period of the first CS signal to obtain a C/A input signal; and sample the C/A input signal on the basis of the clock pulse signal to obtain a C/A output signal.

In some embodiments, the step of sampling the first C/A signal during a valid signal period of the first CS signal to obtain a C/A input signal includes: invert the first C/A signal to obtain a second C/A signal; and perform logic NOR on the second C/A signal and the first CS signal to obtain a C/A input signal.

The input signal sampling system may also perform any steps in the above input signal sampling method. For the specific limitation on the input signal sampling system, reference may be made to the above limitation on the input signal sampling method. Details are not described herein again. Various circuits in the above input signal sampling system may be implemented fully or partially through software, hardware, and a combination thereof. The circuits may be embedded in or independent of a processor of a computer device in a form of hardware, or stored in a memory of the computer device in a form of software, such that the processor can easily invoke and execute corresponding operations of the circuits.

The present disclosure further provides a computer device. The computer device includes a memory and a processor, where the memory stores a computer program, and the computer program is executed by the processor to implement the steps of the method according to any one of the above embodiments.

The present disclosure further provides a computer-readable storage medium. The computer-readable storage medium stores a computer program, and the computer program is executed by a processor to implement the steps of the method according to any one of the above embodiments.

The technical characteristics of the above embodiments can be employed in arbitrary combinations. In an effort to provide a concise description of these embodiments, not all possible combinations of all technical characteristics of the embodiments are described; however, these combinations of technical characteristics should be construed as disclosed in the description as long as no contradiction occurs.

The foregoing embodiments are intended to illustrate several implementations of the present disclosure in detail, and they should not be construed as a limitation to the patentable scope of the present disclosure. It should be noted that those of ordinary skill in the art can further make variations and improvements without departing from the conception of the present disclosure. These variations and improvements all fall within the protection scope of the present disclosure. Therefore, the protection scope of the present disclosure should be subject to the protection scope defined by the claims.

Industrial Applicability

According to the input sampling system and method provided by the present disclosure, the first CS signal is obtained by broadening the pulse width of the valid signal in the initial CS signal backward, such that when a control command signal is sampled according to the first CS signal and the clock signal, since the end moment of the valid signal in the first CS signal is later than the end moment of the valid signal in the original initial CS signal, even if the C/A signal deviates from the initial CS signal, the duration of the valid signal in the C/A signal is still contained in the duration of the valid signal in the first CS signal. Therefore, C/A signal sampling failure can be avoided.

The invention claimed is:

1. An input sampling system, comprising:
   a signal processing circuit, configured to receive an initial chip select signal and a command/address signal, and broaden a pulse width of a valid signal in the initial chip select signal backward to obtain and output a first chip select signal, to control an end moment of a valid signal in the first chip select signal to be later than an end moment of a valid signal in the command/address signal; and
   an input sampling circuit, connected to the signal processing circuit, and configured to receive the command/address signal, the first chip select signal, and a clock pulse signal, and sample the command/address signal according to the first chip select signal and the clock pulse signal.

2. The input sampling system according to claim 1, further comprising:
   a signal generation circuit, connected to the signal processing circuit, and configured to send the initial chip select signal and the command/address signal, and control an arrival moment of the valid signal in the initial chip select signal to be earlier than an arrival moment of the valid signal in the command/address signal when a moment at which the signal generation circuit sends the initial chip select signal is earlier than a moment at which the signal generation circuit sends the command/address signal.

3. The input sampling system according to claim 1, wherein the signal processing circuit is further configured to broaden the pulse width of the valid signal in the initial chip select signal forward, to control an arrival moment of the valid signal in the first chip select signal to be earlier than an arrival moment of the valid signal in the command/address signal.

4. The input sampling system according to claim 3, wherein the signal processing circuit comprises:
   an initial chip select signal receiving sub-circuit, configured to receive the initial chip select signal and delay the initial chip select signal to output a second chip select signal;
   a command/address signal receiving sub-circuit, configured to receive the command/address signal and delay the command/address signal to output a first command/address signal, wherein an absolute delay of the initial chip select signal receiving sub-circuit is less than an absolute delay of the command/address signal receiving sub-circuit; and
   a logic processing sub-circuit, connected to the initial chip select signal receiving sub-circuit and the command/address signal receiving sub-circuit, and configured to delay the second chip select signal to obtain a third chip select signal and obtain the first chip select signal according to the second chip select signal and the third chip select signal, wherein the arrival moment of the valid signal in the first chip select signal is the same as an arrival moment of a valid signal in the second chip select signal, and the end moment of the valid signal in the first chip select signal is the same as an end moment of a valid signal in the third chip select signal.

5. The input sampling system according to claim 4, wherein the initial chip select signal receiving sub-circuit comprises a first comparator provided with a non-inverting input terminal for inputting the initial chip select signal, an inverting input terminal for inputting a first reference voltage, and an output terminal for outputting the second chip select signal, wherein if a voltage of the initial chip select signal is higher than the first reference voltage, the second chip select signal is a high-level signal, and if the voltage of the initial chip select signal is lower than the first reference voltage, the second chip select signal is a low-level signal, and the low-level signal in the second chip select signal is the valid signal in the second chip select signal.

6. The input sampling system according to claim 4, wherein the command/address signal receiving sub-circuit comprises a second comparator provided with a non-inverting input terminal for inputting the command/address signal, an inverting input terminal for inputting a second reference voltage, and an output terminal for outputting the first command/address signal, wherein if a voltage of the command/address signal is higher than the second reference voltage, the first command/address signal is a high-level signal, and if the voltage of the command/address signal is lower than the second reference voltage, the first command/address signal is a low-level signal.

7. The input sampling system according to claim 4, wherein the logic processing sub-circuit comprises:
   a third comparator, provided with a non-inverting input terminal for receiving a first clock signal and an inverting input terminal for receiving a second clock signal, and configured to compare the first clock signal with the second clock signal to output the clock pulse signal;
   a flip-flop, provided with a first input terminal connected to an output terminal of the initial chip select signal receiving sub-circuit for receiving the second chip select signal and a second input terminal connected to the third comparator for receiving the clock pulse signal, and configured to delay the second chip select signal according to the clock pulse signal to obtain the third chip select signal; and
   an AND gate, provided with a first input terminal connected to the output terminal of the initial chip select signal receiving sub-circuit for receiving the second chip select signal and a second input terminal connected to an output terminal of the flip-flop for receiving the third chip select signal, and configured to perform logic AND on the second chip select signal and the third chip select signal to obtain the first chip select signal.

8. The input sampling system according to claim 7, wherein the flip-flop is a rising edge flip-flop, and an arrival moment of the valid signal in the third chip select signal outputted by the rising edge flip-flop is the same as an arrival moment of a first rising edge of the clock pulse signal after the valid signal in the second chip select signal arrives.

9. The input sampling system according to claim 7, wherein the clock pulse signal is a periodic signal, and the valid signals in the initial chip select signal, the second chip select signal, the third chip select signal, and the first chip select signal are all low-level signals.

10. The input sampling system according to claim 7, wherein the input sampling circuit comprises:
an input signal acquisition sub-circuit, provided with a first input terminal connected to an output terminal of the AND gate for receiving the first chip select signal and a second input terminal connected to the command/address signal receiving sub-circuit for receiving the first command/address signal, and configured to sample the first command/address signal during a valid signal period of the first chip select signal to obtain a command/address input signal; and
an input sampling sub-circuit, provided with a first input terminal connected to an output terminal of the input signal acquisition sub-circuit for receiving the command/address input signal and a second input terminal connected to an output terminal of the third comparator for receiving the clock pulse signal, and configured to sample the command/address input signal on the basis of the clock pulse signal to obtain a command/address output signal.

11. The input sampling system according to claim 10, wherein the input signal acquisition sub-circuit comprises:
a NOT gate, provided with an input terminal connected to the command/address signal receiving sub-circuit for receiving the first command/address signal, and configured to invert the first command/address signal to obtain a second command/address signal; and
a NOR gate, provided with a first input terminal connected to the output terminal of the AND gate for receiving the first chip select signal and a second input terminal connected to an output terminal of the NOT gate for receiving the second command/address signal, and configured to perform logic NOR on the second command/address signal and the first chip select signal to obtain the command/address input signal.

12. An input sampling method, comprising:
acquiring an initial chip select signal and a command/address signal;
broadening a pulse width of a valid signal in the initial chip select signal backward to obtain a first chip select signal, to control an end moment of a valid signal in the first chip select signal to be later than an end moment of a valid signal in the command/address signal;
acquiring a clock pulse signal; and
sampling the command/address signal on the basis of the first chip select signal and the clock pulse signal.

13. The input sampling method according to claim 12, further comprising:
broadening the pulse width of the valid signal in the initial chip select signal forward, to control an arrival moment of the valid signal in the first chip select signal to be earlier than an arrival moment of the valid signal in the command/address signal.

14. A computer device, comprising a memory and a processor, the memory storing a computer program, wherein the computer program is executed by the processor to implement steps of the method according to claim 12.

15. A computer-readable storage medium, storing a computer program, wherein the computer program is executed by a processor to implement steps of the method according to claim 12.

* * * * *